(12) United States Patent
Maemura

(10) Patent No.: US 7,554,394 B2
(45) Date of Patent: Jun. 30, 2009

(54) POWER AMPLIFIER CIRCUIT

(75) Inventor: Kosei Maemura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 98 days.

(21) Appl. No.: 11/834,216

(22) Filed: Aug. 6, 2007

(65) Prior Publication Data
US 2008/0231358 A1  Sep. 25, 2008

(30) Foreign Application Priority Data
Mar. 23, 2007  (JP) ............... 2007-077328

(51) Int. Cl.
*H03F 3/68* (2006.01)
*H03F 1/14* (2006.01)
(52) U.S. Cl. .............. 330/124 R; 330/51; 330/144
(58) Field of Classification Search ............ 330/51, 330/84, 124 R, 144
See application file for complete search history.

(56) References Cited

U.S. PATENT DOCUMENTS

| | | | |
|---|---|---|---|
| 4,910,478 A | | 3/1990 | Koyama |
| 5,256,987 A | * | 10/1993 | Kibayashi et al. .......... 330/295 |
| 5,548,246 A | | 8/1996 | Yamamoto et al. |
| 6,288,606 B1 | * | 9/2001 | Ekman et al. ............. 330/51 |
| 6,320,913 B1 | | 11/2001 | Nakayama |
| 6,781,455 B2 | | 8/2004 | Kim |
| 6,972,618 B2 | | 12/2005 | Kim et al. |

FOREIGN PATENT DOCUMENTS

| | | |
|---|---|---|
| JP | 1-311707 | 12/1989 |
| JP | 5-145357 | 6/1993 |
| JP | 7-336168 | 12/1995 |
| JP | 11-17561 | 1/1999 |
| JP | 2000-349574 | 12/2000 |
| JP | 2001-68952 | 3/2001 |
| JP | 2001-185967 | 7/2001 |
| JP | 2006-135528 | 5/2006 |

* cited by examiner

*Primary Examiner*—Steven J Mottola
(74) *Attorney, Agent, or Firm*—Leydig, Voit & Mayer, Ltd.

(57) ABSTRACT

In a third operation in an amplifier, in which first and second amplifier circuits amplify a input signal, a distribution circuit adjusts the power of the signal supplied to the first amplifier circuit to within a range in which the input power to the first amplifier circuit and the output power from the first amplifier are proportional to each other. In a linear operation, the power of the signal from the first amplifier circuit and input to the comparison circuit and the power of the signal from the second amplifier circuit and input to the comparison circuit are equal. The comparison circuit adjusts the gain or the saturated power of the second amplifier circuit on the basis of the difference between the signals from the first and second amplifier circuits and input to the comparison circuit, so that the input power to the second amplifier circuit and the output power from the second amplifier circuit are proportional to each other.

12 Claims, 7 Drawing Sheets signal from first amplifier circuit signal from second amplifier circuit before correction output signal from comparison circuit output signal

POWER AMPLIFIER CIRCUIT

BACKGROUND OF THE INVENTION

1. Field of the Invention

The present invention relates to a power amplifier circuit which amplifies a radiofrequency signal and, more particularly, to a power amplifier circuit capable of increasing power efficiency both during high-power operation and during low-power operation.

2. Background Art

A power amplifier circuit is designed so as to maximize the power efficiency at the time of amplification of power to a high level in order to improve the power efficiency. This means that the power efficiency is reduced at the time of amplification to a level lower than the high level.

FIG. 12 is a block diagram showing an example of a conventional power amplifier circuit, which is provided with amplifying transistors 22 and 24 in two stages. A power supply voltage (3.5 V) is applied to terminals Vc1, Vc2, and Vcb. When an ON signal is supplied to a control terminal cont1, the control circuit 14 operates the amplifying transistors 22 and 24. A radiofrequency signal supplied to an input terminal IN passes an input matching circuit 21, the amplifying transistor 22 in the first stage, an interstage matching circuit 23, the amplifying transistor 24 in the second stage and an output matching circuit 25 one after another and is output from an output terminal OUT.

FIG. 13 is a diagram showing the relationship between the output power and the power efficiency of a conventional power amplifier circuit. For example, a transmission power amplifier circuit for use in CDMA (code division multiple access) telephones has a maximum output of 27 dBm and the power efficiency when the power amplifier circuit outputs this power (in high-power operation) is about 45%. On the other hand, the power efficiency at an output of 17 dBm (in low-power operation) is extremely low, about 15%. Therefore the power supply voltage in low-power operation is reduced to improve the efficiency. For example, the power efficiency is improved to about 25% by reducing the power supply voltage to 1.5 V. However, there is a problem that a need arises for a DC/DC converter for reducing the power supply voltage.

FIG. 14 is a block diagram showing another example of the conventional power amplifier circuit. This amplifier circuit has a bypass circuit 61 for bypassing the amplifying transistor 24 in the second stage. When an OFF signal is supplied to a control terminal cont2, the control circuit 14 stops the operation of the amplifying transistor 24 in the second stage. The signal is then output via the bypass circuit 61. In this case, no current flows through the amplifying transistor 24 in the second stage, so that the power efficiency is increased. Even when the ordinary power supply voltage is fixed at 3.5 V, a power efficiency of about 25% can be obtained, for example, at an output of 16 dBm (in low-power operation).

In this arrangement, there is a need for a selection switch or a combining circuit for combining signals from the two paths in the output section. FIG. 15 is a diagram showing a conventional power amplifier circuit using a selection switch 62. FIG. 16 is a diagram showing a conventional power amplifier circuit using a combining circuit 13 (see, for example, Japanese Patent Laid-Open No. 2001-185967).

Power efficiency $\eta$ is expressed by $\eta$=output power/power supply voltage/consumption current. If no combining circuit or the like is provided, and if the output power is 27 dBm; the power supply voltage is 3.5 V; and the power efficiency is 45%, the consumption current is Ict $10^{27/10}/3.5/0.45=318$ mA.

On the other hand, if the loss in a combining circuit or the like is 0.5 dB, power of 27.5 dBm is required in the stage before the combining circuit or the like. Accordingly, if the power efficiency at the stage before the combining circuit or the like is 45%, the consumption current is Ict $10^{27.5/10}/3.5/0.45=357$ mA. Accordingly, the output from the power amplifier circuit decreases by 0.5 dB to be 27 dBm, and the power efficiency at the stage following the combining circuit or the like is reduced to 40%. That is, the circuits shown in FIGS. 14 to 16 are capable of improving the power efficiency during low-power operation but have reduced power efficiency during high-power operation.

SUMMARY OF THE INVENTION

In view of the above-described problem, an object of the present invention is to provide a power amplifier circuit capable of improving the power efficiency both during high-power operation and during low-power operation.

According to one aspect of the present invention, a power amplifier circuit comprises a first amplifier circuit which amplifies a signal in first and third operations; a second amplifier circuit which amplifies a signal in second and third operations; a distribution circuit which inputs an input signal to the first amplifier circuit in the first operation, inputs the input signal to the second amplifier circuit in the second operation, and distributes and inputs the input signal to the first and second amplifier circuits in the third operation; a combining circuit which combines output signals from the first and second amplifier circuits in the third operation; and a control circuit which controls the first and second amplifier circuits, the distribution circuit and the combining circuit. The distribution circuit adjusts, in the third operation, the power of the signal input to the first amplifier circuit within a range in which the power of the input to the first amplifier circuit and the power of the output from the first amplifier circuit are proportional to each other. The power of the signal input from the first amplifier circuit to the comparison circuit and the power of the signal input from the second amplifier circuit to the comparison circuit are equal to each other in a linear operation in which the power of the input to the first and second amplifier circuits and the power of the output from the first and second amplifier circuits are proportional to each other. The comparison circuit adjusts the gain or the saturated power of the second amplifier circuit on the basis of the difference between the signals input from the first and second amplifier circuits to perform such control that the power input to the second amplifier circuit and the power output from the second amplifier circuit are proportional to each other.

The present invention makes it possible to improve the power efficiency both during high-power operation and during low-power operation.

Other and further objects, features and advantages of the invention will appear more fully from the following description.

DETAILED DESCRIPTION OF THE PREFERRED EMBODIMENTS

First Embodiment

Figure 1:
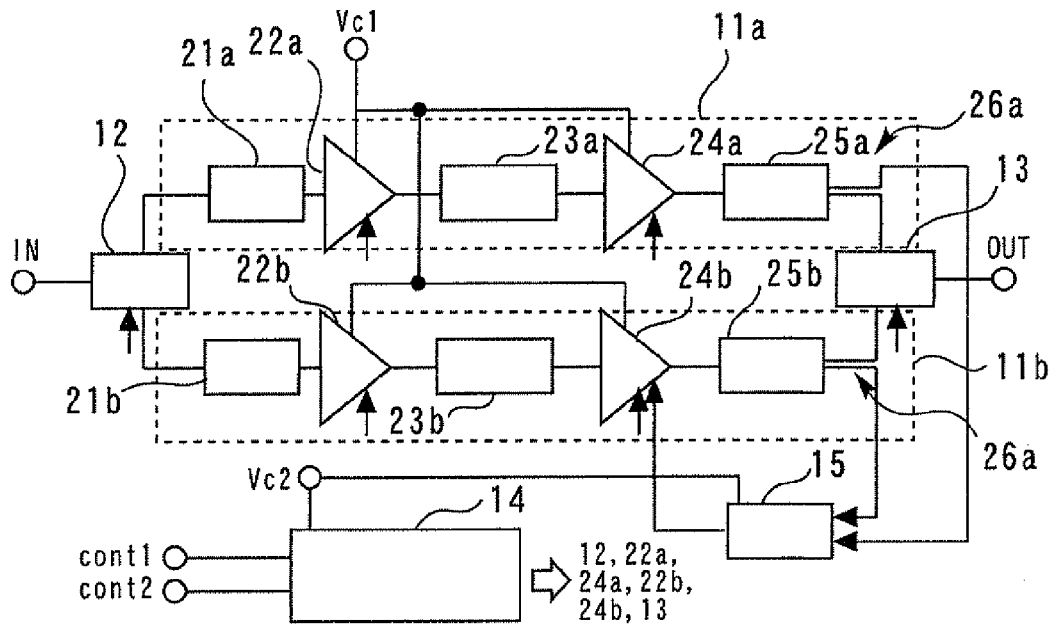
FIG. 1 is a block diagram showing a power amplifier circuit according to the first embodiment of the present invention.

FIG. 1 is a block diagram showing a power amplifier circuit according to the first embodiment of the present invention. The power amplifier circuit includes first and second amplifier circuits 11a and 11b, a distribution circuit 12, a combining circuit 13, a control circuit 14, a comparison circuit 15, an input terminal IN, an output terminal OUT, control terminals cont1 and cont2, and power supply terminals Vc1 and Vc2.

The first amplifier circuit 11a includes an input matching circuit 21a, an amplifying transistor 22a in a first stage, an interstage matching circuit 23a, an amplifying transistor 24a in a second stage, an output matching circuit 25a, and a first coupling circuit 26a. Similarly, the second amplifier circuit 11b includes an input matching circuit 21b, an amplifying transistor 22b in a first stage, an interstage matching circuit 23b, an amplifying transistor 24b in a second stage, an output matching circuit 25b, and a first coupling circuit 26b.

The amplifying transistors 22a and 24a in the first amplifier circuit 11a are smaller in size than the amplifying transistors 22b and 24b in the second amplifier circuit 11b (e.g., 1/5 or less). Therefore the output power of the first amplifier circuit 11a is lower than that of the second amplifier circuit 11b. A voltage of 3.5 V is applied to the power supply terminal Vc1 for the amplifying transistors 22a, 24a, 22b, and 24b and to the power supply terminal Vc2 for the control circuit 14 and the comparison circuit 15.

An output signal from the control circuit 14 is supplied to the gate or the base of each of the amplifying transistors 22a, 24a, 22b, and 24b. That is, the control circuit 14 controls gate or base voltages on the amplifying transistors 22a, 24a, 22b, and 24b of the first and second amplifier circuits 11a and 11b to make the first and second amplifier circuits 11a and 11b perform one of first to third operations. An output signal from the comparison circuit 15 is input to the base of the amplifying transistor 24b in the second stage of the second amplifier circuit 11b together with the output signal from the control circuit 14.

Figure 2:
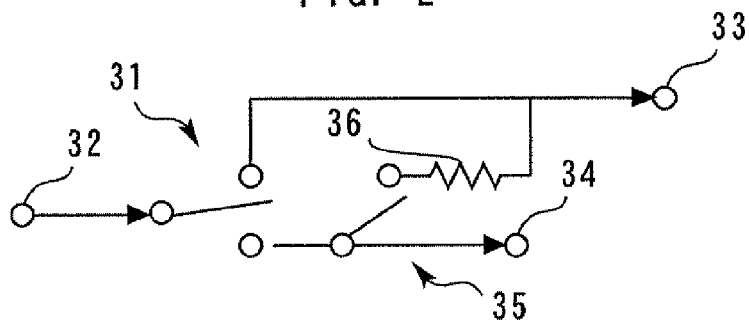
FIG. 2 is a diagram showing an example of a configuration of the distribution circuit.

FIG. 2 is a diagram showing an example of a configuration of the distribution circuit. A first switch 31 is operated according to an output signal from the control circuit 14 to select whether an input terminal 32 is connected to an output terminal 33 to the first amplifier circuit 11a or to an output terminal 34 to the second amplifier circuit 11b. A second switch 35 is operated according to the output signal from the control circuit 14 to select whether or not the input terminal 32 is connected to the output terminal 33 via an attenuator 36.

The operation of the power amplifier circuit according to the first embodiment of the present invention will now be described. The control circuit 14 controls the first and second amplifier circuits 11a and 11b, the distribution circuit 12 and the combining circuit 13 according to controls signals supplied to the control terminals cont1 and cont2 from the outside to make these circuits perform operations described below.

When the power amplifier circuit is not operated, 0 V is applied to each of the control terminals cont1 and cont2. In this case, the output signal from the control circuit 14 is 0 V and no base voltage is input to each of the amplifying transistors 22a, 24a, 22b, and 24b. Accordingly, each of the first and second amplifier circuits 11a and 11b does not operate and the power amplifier circuit outputs no signal.

When a low output (e.g., 16 dBm or less) is to be obtained (when the first operation is performed), a high level (e.g., 3 V) is applied to the control terminal cont1 and a low level (e.g., 0 V) is applied to the control terminal cont2. The first switch 31 in the distribution circuit 12 connects the input terminal 32 and the output terminal 33 according to the signal supplied from the control circuit 14 at this time. The second switch 35 is open, not connecting the input terminal 32 and the attenuator 36. As a result, the signal input from the input terminal 32 is output from the output terminal 33. That is, the distribution circuit 12 supplies an input signal input from the input terminal IN only to the first amplifier circuit 11a. Also, the base voltage is input from the control circuit 14 to each of the amplifying transistors 22a and 24a, and the first amplifier circuit 11a amplifies the input signal. This amplified signal is output from the output terminal OUT via the combining circuit 13.

When a medium output (e.g., 16 to 26 dBm) is to be obtained (when the second operation is performed), the low level is applied to the control terminal cont1 and the high level is applied to the control terminal cont2. The first switch 31 in the distribution circuit 12 connects the input terminal 32 and the output terminal 34 according to the signal supplied from the control circuit 14 at this time. The second switch 35 is open, not connecting the input terminal 32 and the attenuator 36. As a result, the signal input from the input terminal 32 is output from the output terminal 34. That is, the distribution circuit 12 supplies an input signal only to the second amplifier circuit 11b. Also, the base voltage is input from the control circuit 14 to each of the amplifying transistors 22b and 24b, and the second amplifier circuit 11b amplifies the input signal. This amplified signal is output from the output terminal OUT via the combining circuit 13.

When a high output is to be obtained (when the third operation is performed), the high level is applied to each of the control terminals cont1 and cont2. The first switch 31 connects the input terminal 32 and the output terminal 34 according to the signal supplied from the control circuit 14 at this time, and the second switch 35 connects the input terminal 32 and the attenuator 36. The distribution circuit 12 thereby distributes and inputs the input signal to the first and second amplifiers 11a and 11b. Also, the base voltage is input from the control circuit 14 to each of the amplifying transistors 22a, 24a, 22b, and 24b, and both the first and second amplifier circuits 11a and 11b amplify the input signal. The combining circuit 13 combines the output signals from the first and second amplifier circuits 11a and 11b. The output signal from the combining circuit 13 is output from the output terminal OUT.

The amount of attenuation by the attenuator 36 is about 20 dB. In the third operation, therefore, most of the input signal is input to the second amplifier circuit 11b, and only 1/100 power (power of −20 dB) is input to the first amplifier circuit 11a.

The output power of the second amplifier circuit 11b is proportional to the input power when the input power is low, but the proportional relationship is lost when the input power is equal to or higher than 26 dBm. The state in which the proportional relationship between the input power and the output power is lost due to increase of the input power as described above is called "saturation".

The power of the signal input to the first amplifier circuit 11a is low. Therefore the output power of the first amplifier circuit 11a is not saturated and the occurrence of distortion therein is low. In other words, the distribution circuit 12 adjusts, in the third operation, the power of the signal input to the first amplifier circuit 11a within the range in which the power input to the first amplifier circuit 11a and the power output from the first amplifier circuit 11a are proportional to each other. In this way, the power efficiency can be improved during low-power operation. To prevent saturation of the first amplifier circuit 11a, the distribution circuit 12 may distribute the input signal in the third operation so that the power of the signal input to the second amplifier circuit 11b is 10 times higher than that of the signal input to the first amplifier circuit 11a.

First and second coupling circuits 26a and 26b respectively extract signals to be input to the comparison circuit 15 from the output signals from the first and second amplifier circuits 11a and 11b. The amount of coupling of the first coupling circuit 26a is set to −10 dB, while the amount of coupling of the second coupling circuit 26b is set to −30 dB. That is, the amount of coupling of the second coupling circuit 26b is smaller than the amount of coupling of the first coupling circuit 26a. As a result, the power of the signal input from the first amplifier circuit 11a to the comparison circuit 15 and the power of the signal input from the second amplifier circuit 11b to the comparison circuit 15 are equal to each other during the linear operation in which the power input to the first/second amplifiers 11a and 11b and the power output from these amplifiers are proportional to each other.

The first amplifier circuit 11a is not saturated, since the attenuator 36 having an amount of attenuation of about 20 dB is provided on the input side. On the other hand, the second amplifier circuit 11b is saturated when the input power becomes high. In such an event, a difference occurs between the signals input from the first and second amplifier circuits 11a and 11b. The comparison circuit 15 then obtains the difference between the signals input from the first and second amplifier circuits 11a and 11b. The gate or base voltage on the amplifying transistor 24b of the second amplifier circuit 11b is controlled on the basis of this signal difference to adjust the gain or the saturation power of the second amplifier circuit 11b and to thereby perform such control that the power input to the second amplifier circuit 11b and the power output from this amplifier circuit are proportional to each other.

Figure 3:
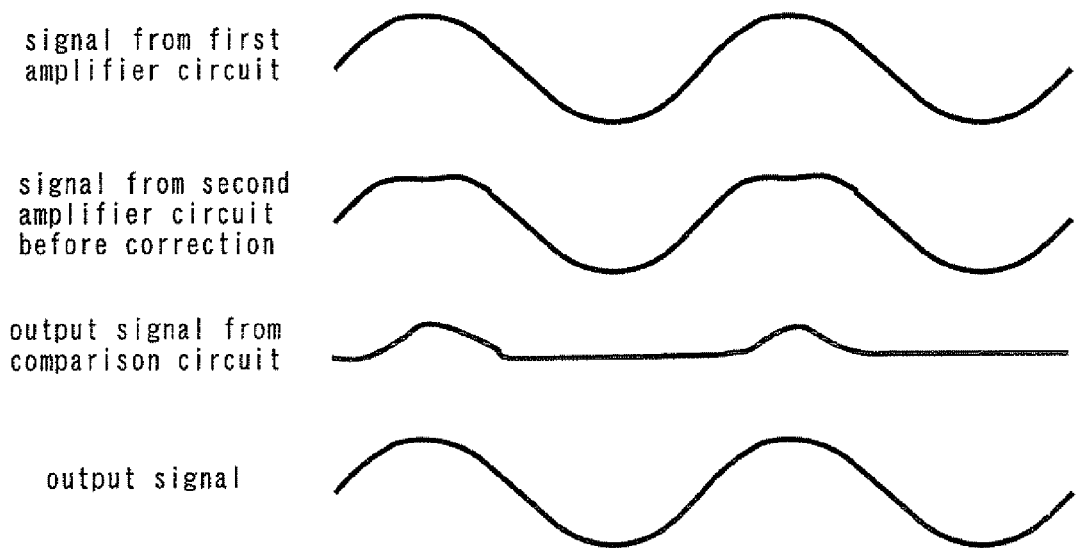
FIG. 3 is a waveform diagram for explaining the operation of the power amplifier circuit according to the first embodiment of the present invention.

FIG. 3 is a waveform diagram for explaining the operation of the power amplifier circuit according to the first embodiment of the present invention. The comparison circuit 15 outputs the difference between the signal from the first amplifier circuit 11a and the signal from the second amplifier circuit 11b before correction. The output signal from the comparison circuit 15 at this time is said to be the result of detection of a distortion in the output signal from the second amplifier circuit 11b. Therefore the output signal from the comparison circuit 15 is converted into a voltage and this voltage is superimposed on the gate or base voltage of the amplifying transistor 24b. The signal from the second amplifier circuit 11b is thereby increased. As a result, the output signal having the distortion reduced can be obtained. That is, the power efficiency can be improved even during high-power operation.

Figure 4:
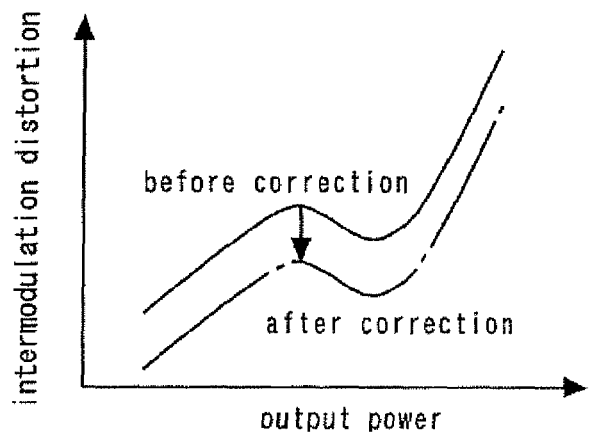
FIG. 4 is a diagram showing the output power dependence of intermodulation distortion.

In the above-described example, the comparison circuit 15 compares the waveforms of the signals supplied from the first and second amplifier circuits 11a and 11b. However, the comparison circuit 15 may make comparison in a different way. The comparison circuit 15 may convert the signals (radiofrequency signals) input from the first and second amplifier circuits 11a and 11b into DC signals and obtain the difference between the voltages. The output voltage from the second amplifier circuit 11b having become smaller than the output voltage from the first amplifier circuit 11a indicates that the operation of the second amplifier circuit 11b has become close to saturation. In this case, the same effect can also be obtained by supplying a signal from the comparison circuit 15 to the gate or base of the amplifying transistor 24b. FIG. 4 is a diagram showing the output power dependence of intermodulation distortion. It has been confirmed that intermodulation distortion can be reduced by increasing the gate or base voltage on the amplifier transistor 24b in the second stage of the second amplifier circuit 11b.

A switch may be used in place of the combining circuit 13 such that only the corresponding one of the first and second amplifier circuits 11a and 11b is on during low-power operation and during medium-power operation, and both the first and second amplifier circuits 11a and 11b are on during high-power operation.

Second Embodiment

Figure 5:
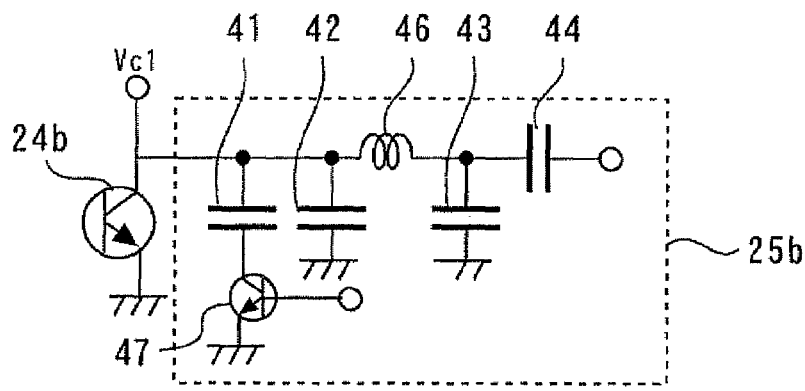
FIG. 5 is a block diagram showing an essential portion of a power amplifier circuit according to the second embodiment of the present invention.

FIG. 5 is a block diagram showing an essential portion of a power amplifier circuit according to the second embodiment of the present invention. An output matching circuit 25b has capacitors 41 to 44, an inductor 46 and a transistor 47. A circuit for converting a radiofrequency signal into a low-frequency signal may be provided between the comparison circuit 15 and the transistor 47. In other respects, the configuration is the same as that of the first embodiment.

The transistor 47 performs an on/off operation by an output signal from the comparison circuit 15 supplied to its base. That is, the comparison circuit 15 adjusts the saturated power of the second amplifier circuit 11b by controlling the output matching circuit 25b of the second amplifier circuit 11b.

The operation of the power amplifier circuit according to the second embodiment of the present invention will now be described. The output signal from the second amplifier circuit 11b is normally off. When this signal is off, the capacitor 41 is seen to be open and the capacitance value is seen to be small with respect to radiofrequencies. When the second amplifier circuit 11b is saturated, the signal is output from the comparison circuit 15 to turn on the transistor 47. The on resistance of the transistor 47 decreases in proportion to the increase in the voltage applied to the base. The resistance between the capacitor 41 and GND is thereby reduced to increase the capacitance of the capacitor 41 with respect to radiofrequencies. Accordingly, the impedance of the output matching circuit 25b is reduced and the saturated power of the second amplifier circuit 11b is increased. As a result, a low-distortion output signal can be obtained. That is, the power efficiency can be improved during high-power operation.

In the third operation, the distribution circuit 12 adjusts the power of the signal input to the first amplifier circuit 11a within the range in which the power input to the first amplifier circuit 11a and the power output from the first amplifier circuit 11a are proportional to each other, as it does in the first embodiment. In this way, the power efficiency can be improved during low-power operation. Consequently, the power efficiency can be improved both during low-power operation and during high-power operation, as in the first embodiment.

Third Embodiment

Figure 6:
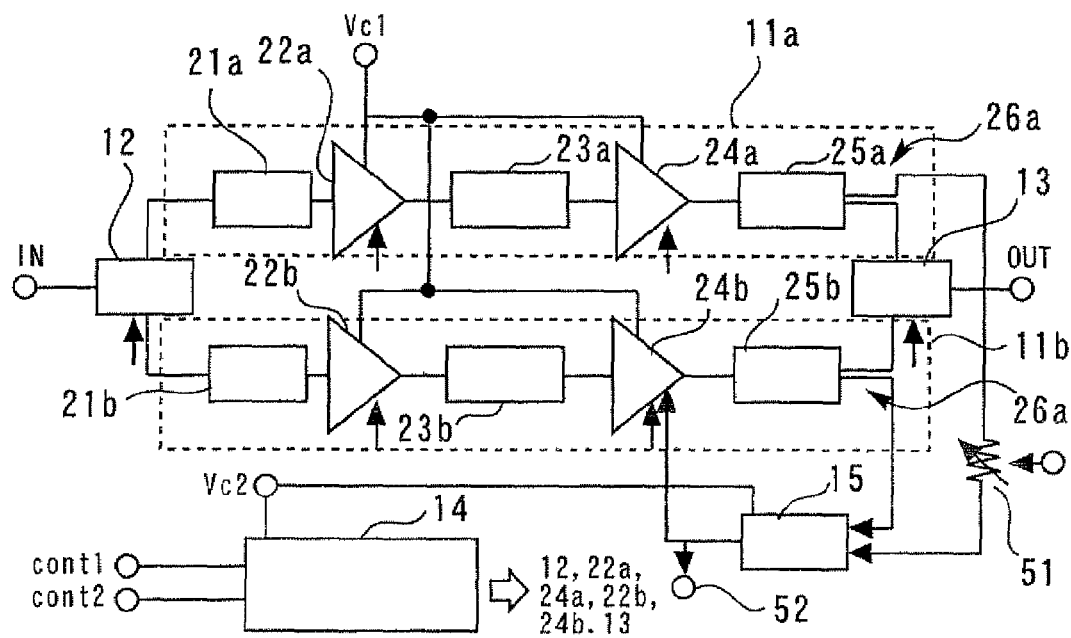
FIG. 6 is a block diagram showing a power amplifier circuit according to the third embodiment of the present invention.

FIG. 6 is a block diagram showing a power amplifier circuit according to the third embodiment of the present invention. An attenuator 51 for attenuating a signal is provided between the first amplifier circuit 11a and the comparison circuit 15. The amount of attenuation by the attenuator 51 can be changed by a signal externally supplied. An output terminal 52 is provided to enable the output from the comparison circuit 15 to be monitored on the outside. In other respects, the configuration is the same as that of the first embodiment. The attenuator 51 may alternatively be provided between the second amplifier circuit 11b and the comparison circuit 15.

In the first and second embodiments, the power input to the comparison circuit 15 is determined by the circuit design. Therefore there is a possibility of a problem with a case where the power input to the comparison circuit 15 is shifted due to a change in a parameter at the time of manufacture. In the third embodiment, therefore, the attenuator 51 is provided.

When both the first and second amplifier circuits 11a and 11b are operated by a small signal, it is necessary that the two inputs to the comparison circuit 15 be equal to each other, since each circuit is not saturated. If the inputs are not equal to each other, the output signal from the comparison circuit 15 is monitored through the output terminal 52. The amount of attenuation by the attenuator 51 is therefore adjusted by an external signal so that the two inputs to the comparison circuit 15 are equal to each other. In this way, the operation can be performed with improved accuracy. The same effect as that of the first embodiment is also achieved.

Fourth Embodiment

Figure 7:
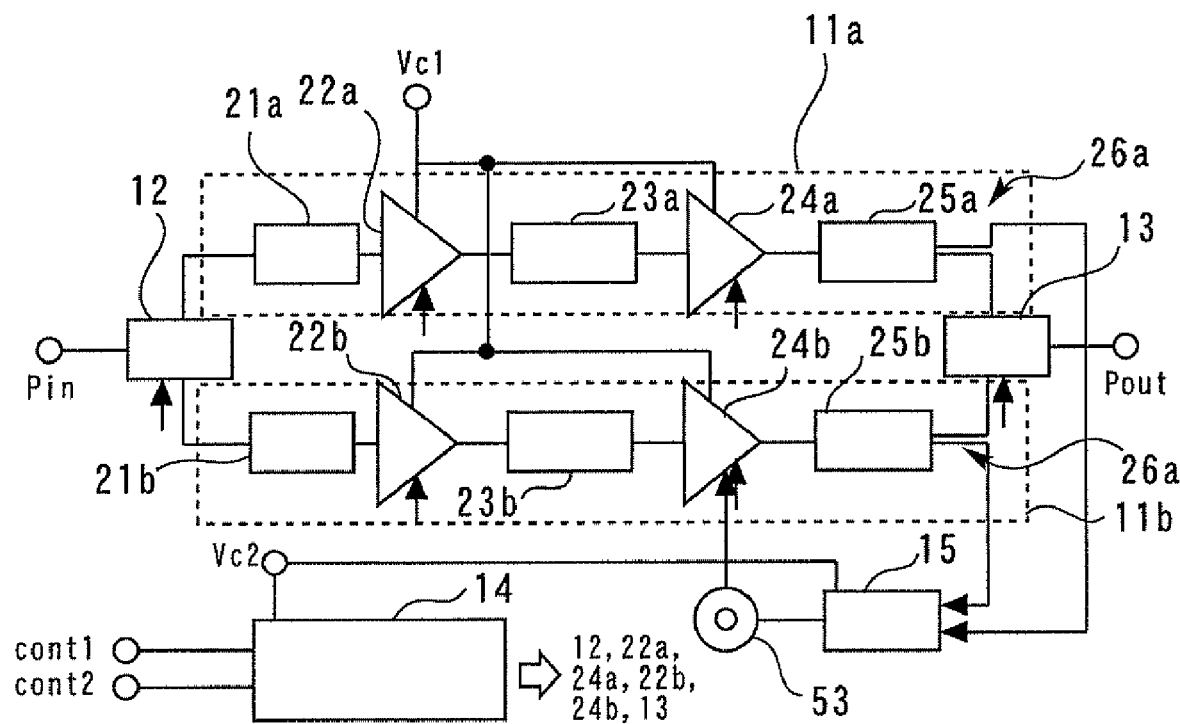
FIG. 7 is a block diagram showing a power amplifier circuit according to the fourth embodiment of the present invention.

FIG. 7 is a block diagram showing a power amplifier circuit according to the fourth embodiment of the present invention. A delay circuit 53 which delays the control signal from the comparison circuit 15 to the second amplifier circuit 11b is provided. In other respects, the configuration is the same as that of the first embodiment. The delay circuit 53 may be constituted by an RC circuit or the like or by a piece of wiring. Also, the arrangement may be such that the signal is temporarily output from the power amplifier and again input after a lapse of a certain time period.

In radiofrequency devices such as portable telephones, the output power is not frequently changed. In a case where signals are transmitted, for example, at intervals of 10 ms, the feedback from the comparison circuit 15 to the second amplifier circuit 11b is delayed by one timing slot by the delay circuit 53. In this way, the frequency of control is reduced to stabilize the circuit operation. The same effect as that of the first embodiment is also achieved.

Fifth Embodiment

Figure 8:
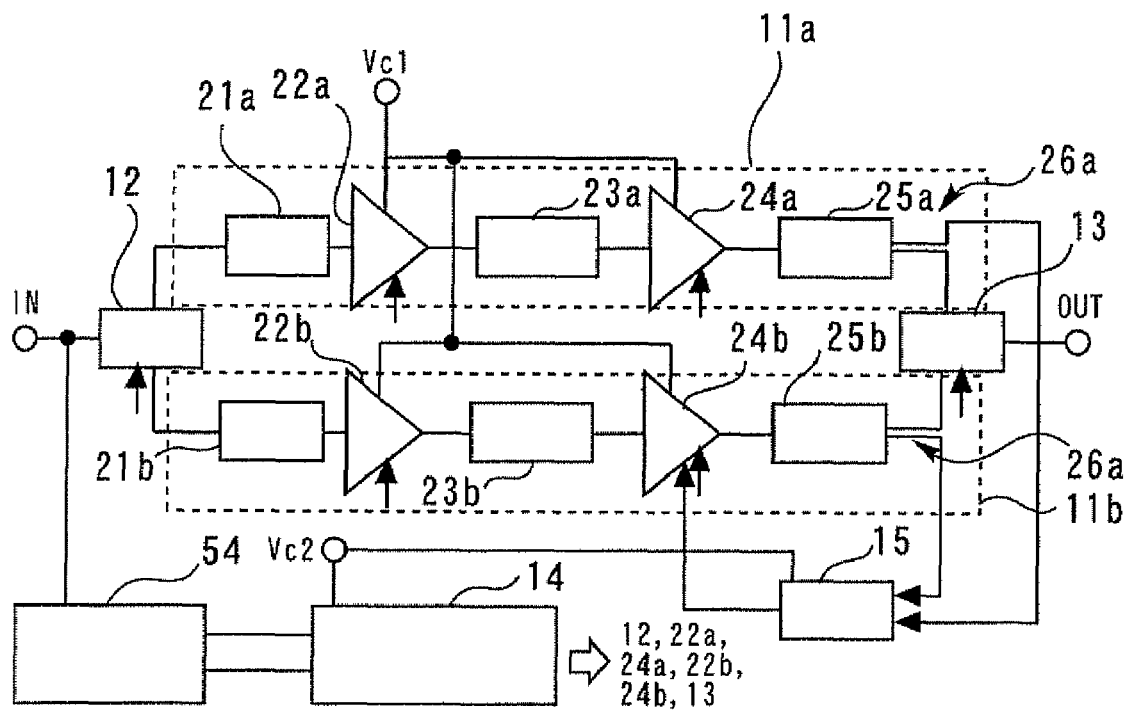
FIG. 8 is a block diagram showing a power amplifier circuit according to the fifth embodiment of the present invention.

FIG. 8 is a block diagram showing a power amplifier circuit according to the fifth embodiment of the present invention. A power detection circuit 54 which detects the power of an input signal is further provided. In other respects, the configuration is the same as that of the first embodiment.

In the first to fourth embodiments, the control circuit 14 controls the first and second amplifier circuits 11a and 11b, the distribution circuit 12 and the combining circuit 13 according to a control signal externally supplied. In contrast, in the fifth embodiment, the control circuit 14 makes the first and second amplifier circuits 11a and 11b, the distribution circuit 12 and the combining circuit 13 perform one of the first to third operations according to the power of the input signal detected by the power detection circuit 54, thus enabling automatic selection from the first to third operations in the circuit. The same effect as that of the first embodiment is also achieved.

Sixth Embodiment

In the third operation, both the first and second amplifier circuits 11a and 11b operate. In this case, in the sixth embodiment of the present invention, the base voltage on the first amplifier circuit 11a supplied from the control circuit 14 is set so that the first amplifier circuit 11a operates in a class-C mode. In other respects, the configuration is the same as that of the first embodiment.

Figure 9:
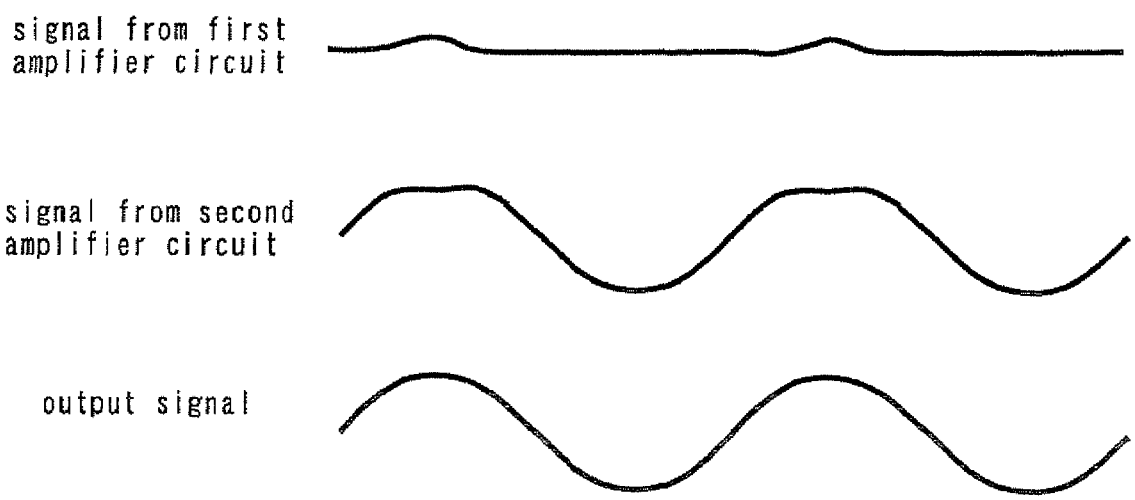
FIG. 9 is a waveform diagram for explaining the operation of the power amplifier circuit according to the sixth embodiment of the present invention.

FIG. 9 is a waveform diagram for explaining the operation of the power amplifier circuit according to the sixth embodiment of the present invention. Since the first amplifier circuit 11a operates in a class-C mode, the output from the first amplifier circuit 11a is a half-wave signal. The phase of this signal is adjusted and this signal is combined with the output from the second amplifier circuit 11b to obtain an output signal. Therefore, when the second amplifier circuit 11b is saturated to cause a distortion in the output therefrom, the distortion can be compensated for by the output from the first amplifier circuit 11a.

In the third operation, the distribution circuit 12 adjusts the power of the signal input to the first amplifier circuit 11a within the range in which the power input to the first amplifier circuit 11a and the power output from the first amplifier circuit 11a are proportional to each other, as it does in the first embodiment. In this way, the power efficiency can be improved during low-power operation. Consequently, the power efficiency can be improved both during low-power operation and during high-power operation, as in the first embodiment.

Seventh Embodiment

Figure 10:
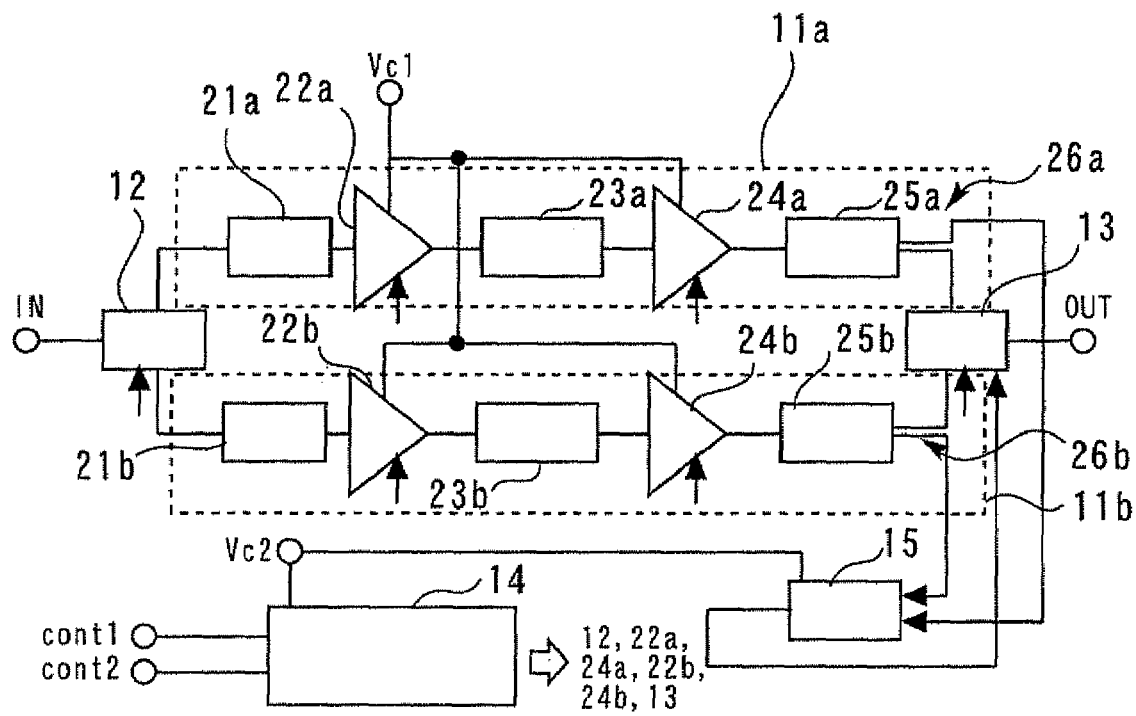
FIG. 10 is a block diagram showing the power amplifier circuit according to the seventh embodiment of the present invention.

FIG. 10 is a block diagram showing the power amplifier circuit according to the seventh embodiment of the present invention. The combining circuit 13 combines the output signals from the first and second amplifier circuits 11a and 11b and the output signal from the comparison circuit 15 in the third operation. The comparison circuit 15 obtains the phase difference between the signals (radiofrequency signals) input from the first and second amplifier circuits 11a and 11b. In other respects, the configuration is the same as that of the first embodiment. In this way, a low-distortion output signal can be obtained. That is, the power efficiency can be improved during high-power operation.

In the third operation, the distribution circuit 12 adjusts the power of the signal input to the first amplifier circuit 11a within the range in which the power input to the first amplifier circuit 11a and the power output from the first amplifier circuit 11a are proportional to each other, as it does in the first embodiment. In this way, the power efficiency can be improved during low-power operation. Consequently, the power efficiency can be improved both during low-power operation and during high-power operation, as in the first embodiment.

If a time for comparison is required in the comparison circuit 15, the arrangement may be such that a delay circuit is provided in the combining circuit 13 and the signals from the first and second amplifier circuits 11a and 11b are delayed before being combined with the signal from the comparison circuit 15. If the power output from the comparison circuit 15 is low, an amplifier circuit for amplifying this signal may be provided between the comparison circuit 15 and the combining circuit 13.

Eighth Embodiment

Figure 11:
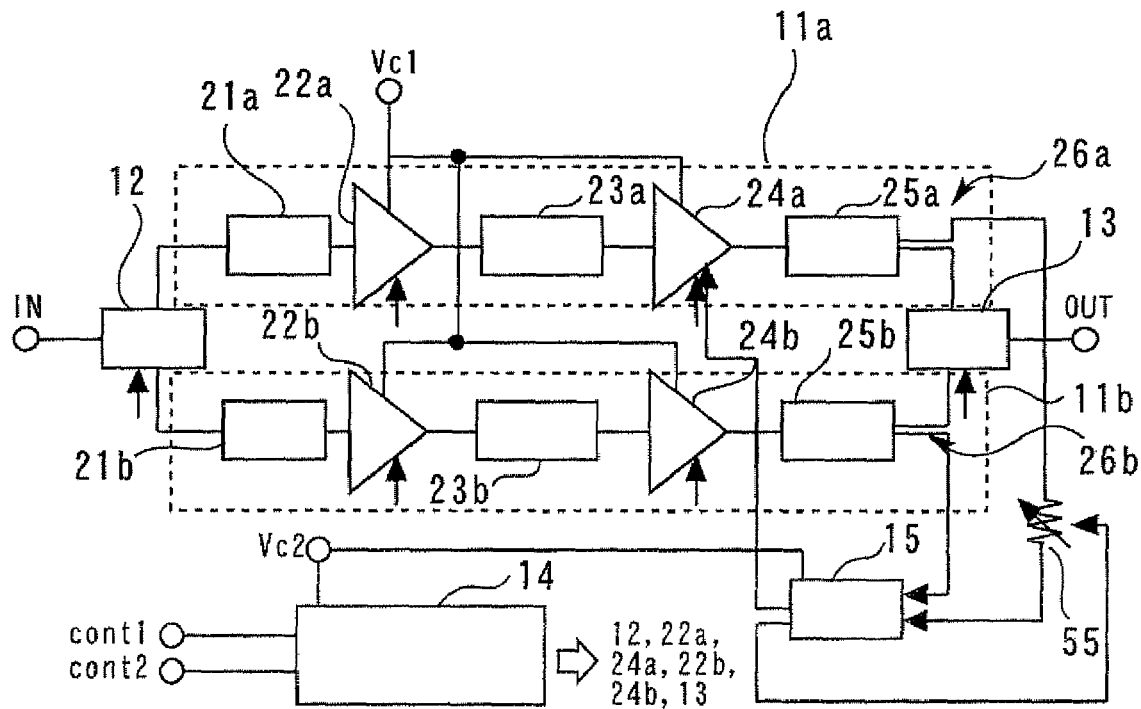
FIG. 11 is a block diagram showing the power amplifier circuit according to the eighth embodiment of the present invention.
Figure 12:
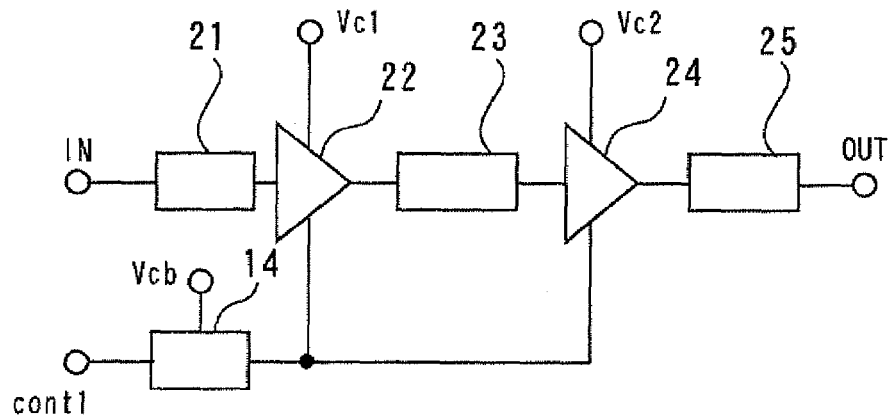
FIG. 12 is a block diagram showing an example of a conventional power amplifier circuit, which is provided with amplifying transistors in two stages.
Figure 13:
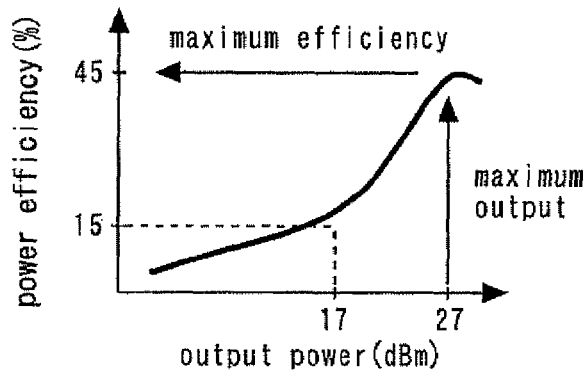
FIG. 13 is a diagram showing the relationship between the output power and the power efficiency of a conventional power amplifier circuit.
Figure 14:
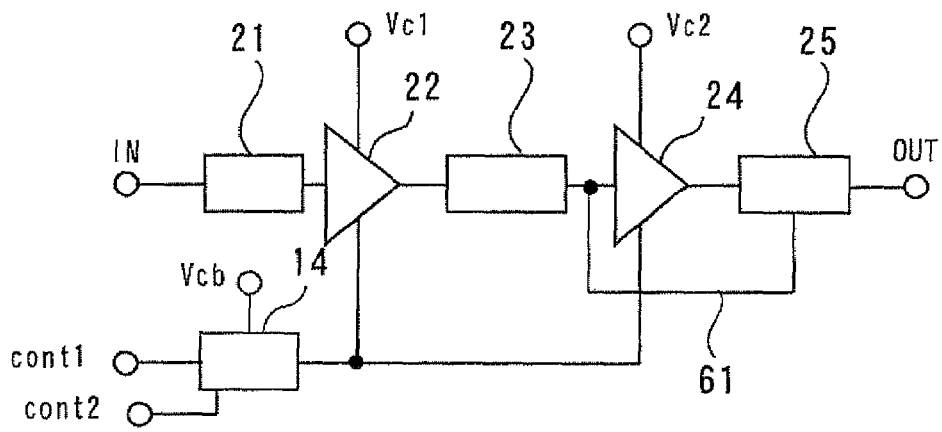
FIG. 14 is a block diagram showing another example of the conventional power amplifier circuit.
Figure 15:
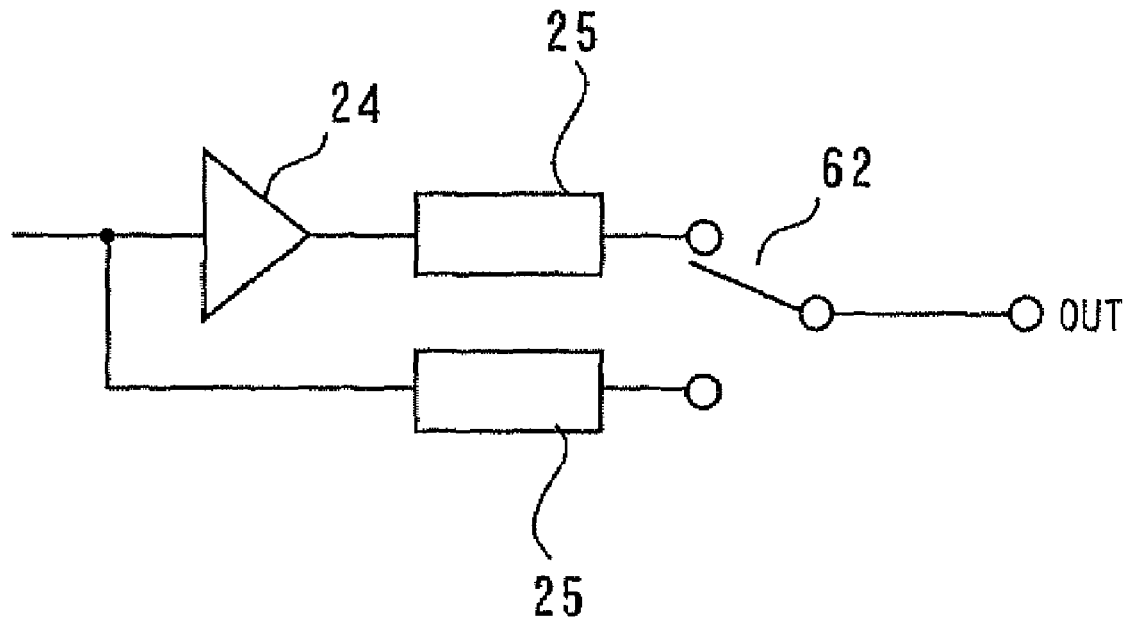
FIG. 15 is a diagram showing a conventional power amplifier circuit using a selection switch.
Figure 16:
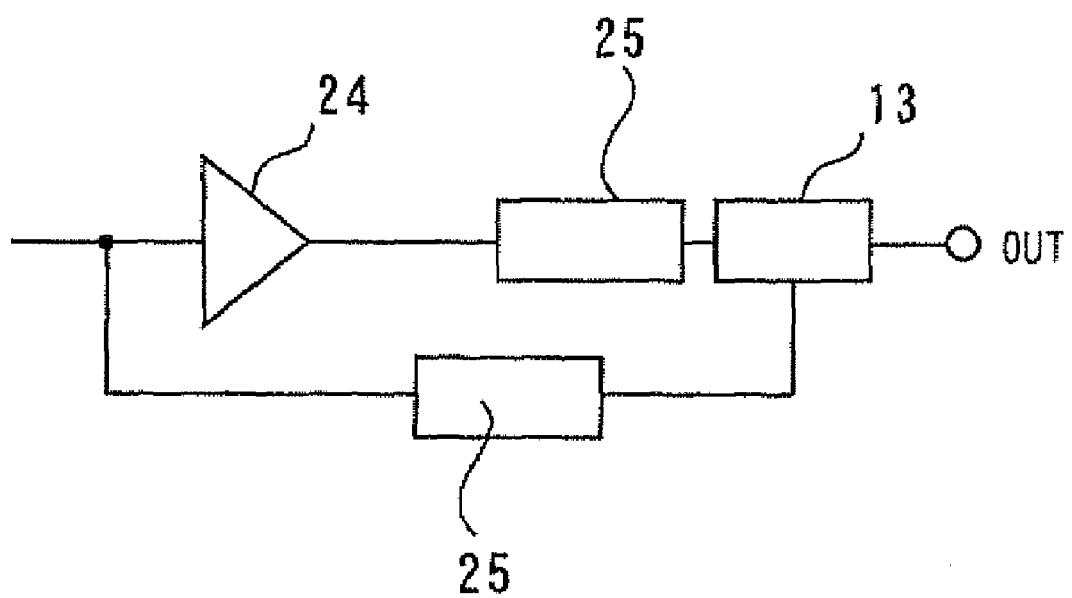
FIG. 16 is a diagram showing a conventional power amplifier circuit using a combining circuit.

FIG. 11 is a block diagram showing the power amplifier circuit according to the eighth embodiment of the present invention. In the eighth embodiment, an attenuator 55 is further provided and the comparison circuit 15 differs in function from that described above. In other respects, the configuration is the same as that of the first embodiment.

During the linear operation in which the power input to the first and second amplifiers 11a and 11b and the power of the output from these amplifier are proportional to each other, the attenuator 55 attenuates the signal input from the first amplifier circuit 11a so that the power of this signal is equal to the power of the signal input from the second amplifier circuit 11b.

While in the first embodiment the signal from the comparison circuit 15 is input to the second amplifier 11b, the signal from the comparison circuit 15 is input to the first amplifier circuit 11a in the eighth embodiment. In the third operation, the comparison circuit 15 compares the output signal from the attenuator 55 and the signal input from the second amplifier circuit 11b. When the power of the output signal from the attenuator 55 becomes lower than the power of the signal input from the second amplifier circuit 11b, the comparison circuit 15 performs such control that the power output from the first amplifier circuit 11a is increased. Therefore, even when the output signal from the second amplifier circuit 11b becomes saturated, the output signal from the second amplifier circuit 11b is coupled to the power-amplified output signal from the first amplifier circuit 11a in the combining circuit 13. As a result, a low-distortion output signal can be obtained. That is, the power efficiency can be improved during high-power operation.

In the third operation, the distribution circuit 12 adjusts the power of the signal input to the first amplifier circuit 11a within the range in which the power input to the first amplifier circuit 11a and the power output from the first amplifier circuit 11a are proportional to each other, as it does in the first embodiment. In this way, the power efficiency can be improved during low-power operation. Consequently, the power efficiency can be improved both during low-power operation and during high-power operation, as in the first embodiment.

Also, the comparison circuit 15 performs such control that the amount of attenuation by the attenuator 55 is increased according to the increase in the output power of the first amplifier circuit 11a. The power of the output signal from the attenuator 55 and the power of the signal input from the second amplifier 11b are thereby equalized to prevent malfunction in the comparison circuit. This operation, however, cannot be continuously performed, since the relationship between the power of the first and second amplifier circuits 11a and 11b and the power of the comparison circuit 15 is lost. Therefore the gain of the first amplifier circuit 11a and the loss from the first amplifier circuit 11a to the comparison circuit 15 are reset to zero at certain times. For example, in a transmission power amplifier for use in a portable telephone operating in a time-division manner, the gain and loss are reset to zero at the beginning of each time slot.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-077328, filed on Mar. 23, 2007 including specification, claims, drawings and summary, on which the Convention priority of the present application is based, are incorporated herein by reference in its entirety.

What is claimed is:

1. A power amplifier circuit comprising:
    a first amplifier circuit which amplifies a signal in first and third operations;
    a second amplifier circuit which amplifies a signal in second and third operations;
    a distribution circuit which supplies an input signal to the first amplifier circuit in the first operation, supplies the input signal to the second amplifier circuit in the second operation, and distributes and supplies the input signal to the first and second amplifier circuits in the third operation;
    a combining circuit which combines output signals from the first and second amplifier circuits in the third operation;
    a comparison circuit which compares output signals from the first and second amplifier circuits; and
    a control circuit which controls the first and second amplifier circuits, the distribution circuit, and the combining circuit, wherein
    the distribution circuit adjusts, in the third operation, power of the signal input to the first amplifier circuit to within a range in which the power of the signal input to the first amplifier circuit and power of the output signal from the first amplifier circuit are proportional to each other,
    the power of the signal from the first amplifier circuit that is input to the comparison circuit and the power of the signal from the second amplifier circuit that is input to the comparison circuit are equal to each other in a linear operation in which the power of the signal input to the first and second amplifier circuits and the power of the output signals from the first and second amplifier circuits are proportional to each other, and
    the comparison circuit adjusts gain or saturated power of the second amplifier circuit based on difference between the signals from the first and second amplifier circuits and input to the comparison circuit so that the power input to the second amplifier circuit and the power output from the second amplifier circuit are proportional to each other.

2. The power amplifier circuit according to claim 1, wherein the comparison circuit converts the signals from the first and second amplifier circuits and input to the comparison circuit into DC signals and obtains the voltage difference therebetween.

3. The power amplifier circuit according to claim 1, wherein
   the first and second amplifier circuits respectively have first and second coupling circuits for extracting, from the output signals, signals to be input to the comparison circuit, and
   coupling of the second coupling circuit is smaller than coupling of the first coupling circuit.

4. The power amplifier circuit according to claim 1, wherein the power of the signal input to the second amplifier circuit by being distributed from the input signal by the distribution circuit in the third operation is 10 times higher than the power of the signal input to the first amplifier circuit.

5. The power amplifier circuit according to claim 1, wherein
   the control circuit controls gate or base voltages of amplifying transistors of the first and second amplifier circuits to make the first and second amplifier circuits perform one of the first to third operations, and
   the comparison circuit controls the gate or base voltage of the amplifying transistor of the second amplifier circuit to adjust gain or saturated power of the second amplifier circuit.

6. The power amplifier circuit according to claim 1, wherein the comparison circuit controls an output matching circuit of the second amplifier circuit to adjust saturated power of the second amplifier circuit.

7. The power amplifier circuit according to claim 1, further comprising an attenuator for attenuating a signal, the attenuator being provided between the first amplifier circuit or the second amplifier circuit and the comparison circuit.

8. The power amplifier circuit according to claim 7, wherein attenuation by the attenuator can be changed by a signal from outside.

9. The power amplifier circuit according to claim 1, further comprising a delay circuit which delays a control signal from the comparison circuit to the second amplifier circuit.

10. The power amplifier circuit according to claim 1, further comprising a power detection circuit which detects the power of the input signal, wherein the control circuit makes the first and second amplifier circuits, the distribution circuit, and the combining circuit perform one of the first, second, and third operations according to the power of the input signal detected by the power detection circuit.

11. A power amplifier circuit comprising:
    a first amplifier circuit which amplifies a signal in first and third operations;
    a second amplifier circuit which amplifies a signal in second and third operations;
    a distribution circuit which supplies an input signal to the first amplifier circuit in the first operation, supplies the input signal to the second amplifier circuit in the second operation, and distributes and supplies the input signal to the first and second amplifier circuits in the third operation;
    a comparison circuit which obtains a phase difference between signals input to the comparison circuit from the first and second amplifier circuits;
    a combining circuit which combines output signals from the first and second amplifier circuits in the third operation and an output signal from the comparison circuit; and
    a control circuit which controls the first and second amplifier circuits, the distribution circuit, and the combining circuit wherein the distribution circuit adjusts, in the third operation, power of the signal input to the first amplifier circuit to within a range in which the power of the signal input to the first amplifier circuit and power of the output signal from the first amplifier circuit are proportional to each other.

12. A power amplifier circuit comprising:
    a first amplifier circuit which amplifies a signal in first and third operations;
    a second amplifier circuit which amplifies a signal in second and third operations;
    a distribution circuit which supplies an input signal to the first amplifier circuit in the first operation, supplies the input signal to the second amplifier circuit in the second operation, and distributes and supplies the input signal to the first and second amplifier circuits in the third operation;
    a combining circuit which combines output signals from the first and second amplifier circuits in the third operation;
    a control circuit which controls the first and second amplifier circuits, the distribution circuit, and the combining circuit; and
    an attenuator which, in a linear operation in which power of the signal input to the first and second amplifier circuits and power of the output signal from the first and second amplifier circuits are proportional to each other, attenuates the signal from the first amplifier circuit and input to the attenuator so that the power of the signal from the first amplifier circuit and input to the attenuator is equal to the power of the signal from the second amplifier circuit and input to the attenuator; and
    a comparison circuit which compares an output signal from the attenuator and a signal from the second amplifier circuit and input to the comparison circuit, wherein
    the distribution circuit adjusts, in the third operation, power of the signal input to the first amplifier circuit to within a range in which the power of the signal input to the first amplifier circuit and the power of the output signal from the first amplifier circuit are proportional to each other, and
    the comparison circuit
        increases the output power of the first amplifier circuit when the power of the signal output from the attenuator becomes lower than the power of the signal input from the second amplifier circuit and input to the comparison circuit, and
        increases attenuation by the attenuator in response to an increase in the output power of the first amplifier circuit.

* * * * *